US006982598B2

(12) United States Patent
Oppelt

(10) Patent No.: US 6,982,598 B2
(45) Date of Patent: Jan. 3, 2006

(54) DIFFERENTIAL AMPLIFIER

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/702,035

(22) Filed: Nov. 6, 2003

(65) Prior Publication Data

US 2004/0145414 A1    Jul. 29, 2004

(30) Foreign Application Priority Data

Nov. 6, 2002   (DE)   ............................ 102 51 702

(51) Int. Cl.
*H03F 3/45*      (2006.01)
(52) U.S. Cl. ...................... 330/256; 330/261
(58) Field of Classification Search ........... 330/252, 330/256, 261, 289; 323/313
See application file for complete search history.

(56) References Cited

U.S. PATENT DOCUMENTS 4,042,886 A * 8/1977 Hanna ...................... 330/256

OTHER PUBLICATIONS

Tietze et al., "Halbleiter-Schaltungstechnik", Springer Verlag, 1986, $8^{th}$ Ed., pp. 66-72.
Tietze, et al., Halbleiter-Schaltungs-Technik, 1999, p. 370.
Beuth, K., Bauelemente, 1991, p. 36.

* cited by examiner

Primary Examiner—Steven J. Mottola
(74) Attorney, Agent, or Firm—Staas & Halsey LLP

(57) ABSTRACT

Two amplifier transistors are arranged in parallel and a current source is connected to a common emitter line of the amplifier transistors and produces a temperature-independent quiescent current. In order for both the small-signal gain and the large-signal response to be independent of temperature, the emitters of the two amplifier transistors are connected to one another by a compensation resistor which has a negative temperature coefficient.

4 Claims, 2 Drawing Sheets

DIFFERENTIAL AMPLIFIER

CROSS REFERENCE TO RELATED APPLICATIONS

This application is based on and hereby claims priority to German Application No. 102 51 702.9 filed on Nov. 6, 2002, the contents of which are hereby incorporated by reference.

BACKGROUND OF THE INVENTION

Differential amplifiers have long been known as basic modules for signal processing in virtually all fields of electrical engineering (for example Tietze, U., Schenk, Ch., "Halbleiterschal-tungstechnik"; Springer Verlag, 1986, 8th Ed., pages 66–72). They have two parallel paths, each having an amplifier transistor and a collector resistor. The lines connected to the emitters of the transistors are connected to one another. A current source for producing a quiescent current is connected into the common emitter line. Non-reactive emitter and base resistors are usually also provided in the circuit and serve the purpose of, for example, setting the operating point of the transistors. An input voltage applied between the base connections of the transistors is amplified to give an output voltage between the collector connections of the transistors.

Major features of differential amplifiers are the so-called small-signal gain and the large-signal response between the input voltage and the output voltage. The small-signal gain and large-signal response can be calculated using relatively simple mathematical expressions. The limit voltage in large-signal operation essentially depends on the quiescent current lb produced by the current source and on the resistance value RC of the collector resistor. The small-signal gain likewise depends on RC and lb as well as directly on the operating temperature T of the circuit and on the resistance value RE of the emitter resistor.

In principle, therefore, with differential amplifiers the small-signal gain is temperature-dependent and the limit voltage in large-signal operation is not, provided lb is not temperature-dependent. In many applications it is not acceptable for there to be temperature dependence. The values RE and RC are generally independent of the temperature. For temperature compensation in the small-signal response, the quiescent current lb has therefore until now been made deliberately temperature-dependent, as a result of which the influence of the temperature in the small-signal gain is compensated for and the small-signal gain is constant in a desired temperature range. The temperature dependence of lb, however, causes the limit voltage to be temperature-dependent in large-signal operation owing to the constant RC value. However, the two amplifier properties are often required to be stable independently of the temperature, for example in the case of dynamic compressors.

SUMMARY OF THE INVENTION

An object of the present invention is to provide a differential amplifier in which small- and large-signal responses are independent of the temperature.

It has been recognized that, in order for the limit voltage to be independent of the temperature, in large-signal gain operation, lb should be independent of the temperature, in particular if the value RC is also independent of the temperature. For temperature compensation in the small-signal response, RE can in this case be temperature-dependent. However, if only the emitter resistor of a conventional differential amplifier circuit were to be made temperature-dependent per se, the open-circuit potentials of the circuit would no longer be constant but would be dependent on the temperature. This is not acceptable in most cases.

A differential amplifier according to the invention has a quiescent current lb which is independent of the temperature. In addition, the emitters of the two transistors are connected to a temperature-dependent compensation resistor having the value RK(T) by a parallel path, and the resistance value of this compensation resistor has a negative temperature coefficient. RK(T) thus decreases as the temperature T increases. The values for the non-reactive fixed resistances (for example RE, RC and RB) provided in the differential amplifier are not temperature-dependent. Owing to the fact that the quiescent current lb is not temperature-dependent, neither is the large-signal response of the differential amplifier. Owing to the compensation resistor lying in the parallel path between the emitters of the amplifier transistors, an emitter resistance is produced which is effective for negative feedback and whose value differs from the non-reactive fixed resistance RE. Since the compensation resistance is included in the calculation, and is temperature-dependent, the effective emitter resistance REE(T) is also temperature-dependent. In a differential amplifier according to the invention, the value for REE(T) is obtained, by computation, from the emitter resistance RE and half the value RK(T)/2 of the temperature-dependent resistance value of the compensation resistance RK(T) connected in parallel. Contributing factors, in addition to RC and lb, to the small-signal gain are the variables for the effective emitter resistance REE(T) and the temperature T. RK(T) is selected such that the temperature response of the effective emitter resistance REE(T) compensates precisely for the influence of the explicit variable T in the small-signal gain.

A differential amplifier according to the invention prevents open-circuit potentials in the circuit from changing depending on the temperature, since the value for the emitter resistance RE remains independent of the temperature. If the amplifier is in equilibrium, the same electrical potentials thus prevail in the two paths and so the added parallel path with the compensation resistor has no current flowing through it, and is thus not included in the calculation of the open-circuit potentials of the circuit. This further increases the stability of the temperature response of the amplifier, in particular since no heat loss occurs in RK(T) as a result of quiescent currents.

In one preferred embodiment, the compensation resistor is formed by the series circuit formed by a negative temperature coefficient (NTC) resistor having a temperature-dependent value RN(T) and a series resistor having a value RV which is independent of the temperature. This simplifies the setting of the temperature response of the effective emitter resistance REE(T). Selection of a fixed and a temperature-dependent resistor in the parallel path between the emitters of the amplifier transistors provides an additional degree of freedom when forming the effective emitter resistance REE (T) from the emitter resistance RE, series resistance RV and NTC resistance RN(T). Favorable selection of the emitter resistance RE and NTC resistance RN(T) makes the series resistance RV unnecessary. The compensation resistance RK(T) thus still has the NTC resistance RN(T) but without a series resistance RV.

In a further preferred embodiment, the current source contains a transistor, which is connected at the collector and the emitter, in series with a bias resistor connected at one end to a supply voltage. In addition, the current source has an operational amplifier whose output is connected to the base of the transistor and whose input is connected to the emitter of the transistor. A reference voltage is applied between the other input to the operational amplifier and the supply voltage. The use of this known current source in the differential amplifier according to the invention stabilizes the temperature of the quiescent current Ib particularly well, and the temperature stability of the current now only depends on the temperature stability of the reference voltage Ur.

In a particularly preferred embodiment, a bandgap norm, which is distinguished by the reference voltage Ur emitted having particularly high temperature stability, is therefore used for the reference voltage Ur.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
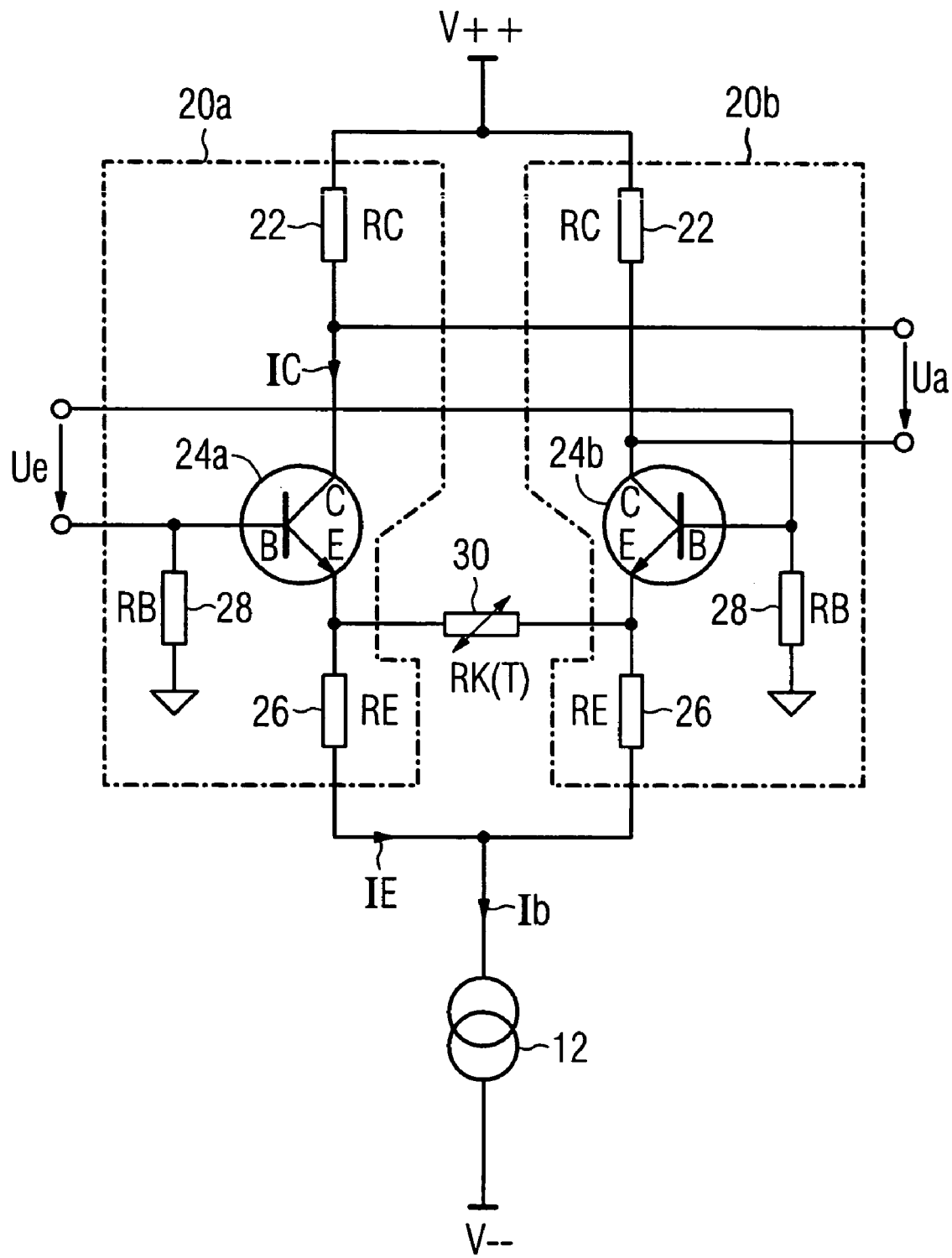
FIG. 1 is an electrical circuit diagram of a differential amplifier having a compensation resistor.

Reference will now be made in detail to the preferred embodiments of the present invention, examples of which are illustrated in the accompanying drawings, wherein like reference numerals refer to like elements throughout.

With the differential amplifier shown in FIG. 1, a current source 12 for producing a quiescent current Ib is connected to a first supply voltage V−−. Connected in series with this current source is a parallel circuit having two identical paths 20a and 20b, which are in turn connected to a second supply voltage V++. The path 20a has the series circuit formed by a collector resistor 22 having the value RC, a transistor 24a and an emitter resistor 26 having the value RE. The transistor 24a is connected by the emitter E and by the collector C in the series circuit. The base B of the transistor 24a is connected to ground via a base resistor 28 having the value RB. The path 20b has an analogous configuration to the path 20a. The components in the two paths are each identical in pairs. For example, in particular in practice, the same type of transistor is used, selected from the same production batch from one component manufacturer, for the transistors 24a and 24b in order that they have characteristics, and thus electrical properties, which are as identical to one another as possible. Better still is the use of transistors 24a and 24b in the form of a dual transistor in a common housing or even on a common chip. An input voltage Ue is applied between the base connections B of the two transistors 24a and 24b. This input voltage Ue is amplified by the differential amplifier to give a voltage Ua between the collector connections C of the transistors 24a and 24b.

The emitters of the transistors 24a and 24b are connected by a parallel path containing a compensation resistor 30 having a resistance value RK(T) which changes with the temperature such that it decreases as the temperature increases. This resistor is therefore one having a negative temperature coefficient. When the differential amplifier is operating, this compensation resistor 30 acts as a negative-feedback resistor in the emitter circuit. Since the resistance value RK(T) of the compensation resistor 30 changes with the temperature, the total effective emitter resistance REE(T) in the paths 20a,b, which depends on RE anu RK(T), changes. Owing to the parallel circuit formed by RE and RK(T)/2 for computational purposes, the value REE(T) is always smaller than RE. When dimensioning the circuit it is therefore necessary first to select a higher value RE than when configuring the differential amplifier without a parallel path, i.e. without a compensation resistor 30. Together with the value RK(T)/2, the higher value for the emitter resistance RE then gives the lower effective resistance value REE(T) in the emitter circuit of the differential amplifier which, at room temperature, essentially corresponds to the original value for the emitter resistance RE.

With the circuit in FIG. 1, the non-reactive fixed resistors 22, 26 and 28 used are as temperature-stable as possible such that they do not have any noticeable influence on the temperature response of the circuit with regard to the small- and large-signal properties.

Given the Boltzmann's constant k, the elementary charge q and the absolute temperature T in degrees Kelvin, the temperature voltage may be found:

$$U_T = \frac{kT}{q} \tag{G1}$$

and, from this, with the aid of the collector current IC through the collector resistor 22, the gradient:

$$S = \frac{IC}{U_T}. \tag{G2}$$

Using the values for the effective emitter resistance REE(T) produced by the emitter resistor 26, RE and the compensation resistor 30, RK(T), $$REE(T) = \frac{RE \cdot RK(T)}{2RE + RK(T)},$$

and for the collector resistor 22, RC, the small-signal voltage gain in the differential amplifier is given by:

$$v = \frac{Ua}{Ue} = \frac{RC}{REE(T) + \frac{1}{S}}. \tag{G3}$$

Now, as IE≈IC and Ib≈2IE, substituting (G1) and (G2) into (G3) gives:

$$v = \frac{RC}{REE(T) + \frac{2kT}{qIb}}. \tag{G4}$$

The small-signal voltage gain v is therefore directly dependent on the temperature T The large-signal response of the circuit depends on the maximum voltage Ua,max, the so-called limit voltage. This maximum voltage is the peak-to-peak value:

$$Ua, max = 2RCIb \quad (G5)$$

Therefore, although it is dependent on Ib, it is not dependent on the temperature.

The temperature response of the circuit shown in FIG. 1 is as follows: since the current Ib is temperature-stable, owing to the configuration of the current source 12, and the resistance value RC is likewise so, the large-signal response of the differential amplifier according to (G5) is temperature-stable. For the small-signal response according to (G4), in this case not only the constants k and q but also Ib and RC are temperature-stable. The influence of the variable T in (G4) is thus compensated for by appropriately selecting the temperature dependence of REE(T). Therefore, the temperature response of the compensation resistor 30, RK(T) is selected such that the denominator in (G4) for temperatures T remains constant in a desired temperature interval between T1 and T2 such that:

$$REE(T) + \frac{2kT}{qIb} = \text{const.} \quad \forall T \in [T1, T2]. \quad (G6)$$

The operating point of a transistor is mainly determined by its quiescent current. The quiescent current for a differential amplifier is determined by the current source. The open-circuit potentials in the differential amplifier are dependent on the quiescent current and, for example, the emitter resistances. By selecting a compensation resistor 30 as a parallel path in the differential amplifier, this path has no current flowing through it when the amplifier is in the quiescent state, since the emitters of the two transistors are at the same electrical potential. The open-circuit potentials are thus not influenced by the compensation resistor 30 anywhere in the circuit, and this in turn contributes to the stabilization of the temperature response of the circuit.

Figure 2:
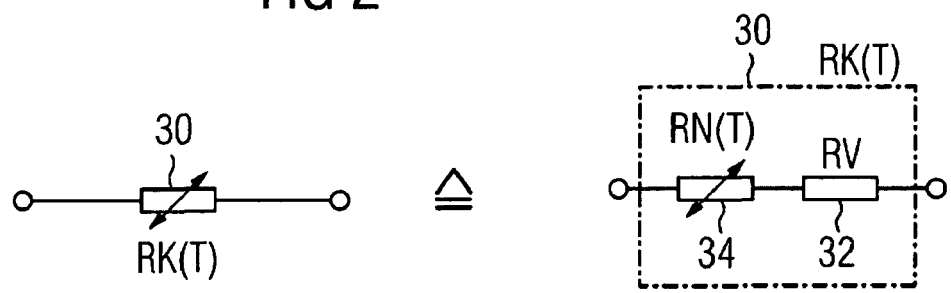
FIG. 2 is an electrical circuit diagram of an embodiment of the temperature-dependent compensation resistor.

In FIG. 2, the compensation resistor 30 includes two single, series-connected resistors, namely a series resistor 32 having the value RV and a temperature-dependent NTC resistor 34 having the value RN(T). An NTC resistor has a temperature/resistance response as specified on the data sheet.

Figure 3:
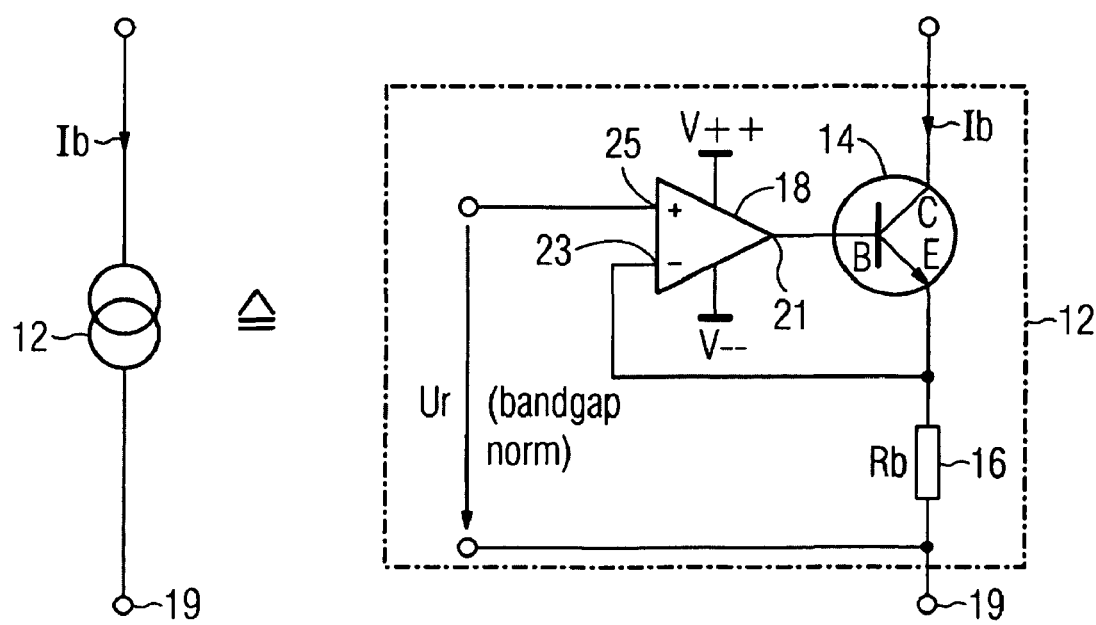
FIG. 3 is an electrical circuit diagram of an embodiment of the temperature-stable current source.

FIG. 3 shows the current source 12 in a very temperature-stable embodiment. This is constructed in a known manner and contains a bias transistor 14, which is connected to the collector and the emitter, connected in series with a bias resistor 16 having the value Rb. The current source 12 also contains an operational amplifier 18 whose output 21 is connected to the base of the transistor 14. In the exemplary embodiment shown, the transistor 14 is a bipolar transistor. Of course, instead of this, a field-effect transistor could also be used. The emitter of the transistor 14 is connected to one input 23 of the operational amplifier 18. A reference voltage Ur with respect to the connection 19 of the current source 12 is applied to the other input 25 of the operational amplifier 18.

A bandgap norm whose voltage is highly stable with respect to the temperature can be used for the reference voltage Ur. If the current source 12 has a bandgap norm, the current source 12 supplies a current Ib which is extremely temperature-stable. Firstly, the voltage produced by the bandgap norm is very temperature-stable. The circuit shown in FIG. 3 produces a very temperature-stable current from this. This circuit thus "transfers" the temperature stability from the voltage to the current.

The invention has been described in detail with particular reference to preferred embodiments thereof and examples, but it will be understood that variations and modifications can be effected within the spirit and scope of the invention.

What is claimed is:

1. A differential amplifier, comprising:
   two amplifier transistors arranged in parallel paths and having emitters, respectively;
   a compensation resistor connecting the emitters of said two amplifier transistors and having a negative temperature coefficient;
   a common emitter line connected to the emitters of said two amplifier transistors; and a current source, connected to said common emitter line, to produce a quiescent current independent of temperature.

2. The differential amplifier as claimed in claim 1, wherein said compensation resistor is a series circuit formed by a negative temperature coefficient resistor and a temperature independent series resistor.

3. The differential amplifier as claimed in claim 2, wherein said current source is connected to a reference voltage and includes
   a bias resistor;
   a bias transistor in series with said bias resistor and having a base and an emitter; and
   an operational amplifier having an output connected to the base of said bias transistor, a first input connected to the emitter of said bias transistor, and a second input connected to the reference voltage with respect to said current to be applied.

4. The differential amplifier as claimed in claim 3, wherein a bandgap norm is used for the reference voltage.

* * * * *